United States Patent [19]

Aoai

[11] Patent Number: 4,752,552
[45] Date of Patent: Jun. 21, 1988

[54] PHOTOSOLUBILIZABLE COMPOSITION

[75] Inventor: Toshiaki Aoai, Kanagawa, Japan

[73] Assignee: Fuji Photo Film Co., Ltd., Kanagawa, Japan

[21] Appl. No.: 85,230

[22] Filed: Aug. 12, 1987

Related U.S. Application Data

[63] Continuation of Ser. No. 625,079, Jun. 27, 1984, abandoned.

[30] Foreign Application Priority Data

| Jun. 29, 1983 | [JP] | Japan | 58-117769 |
| Aug. 10, 1983 | [JP] | Japan | 58-146095 |
| Dec. 6, 1983 | [JP] | Japan | 58-230377 |

[51] Int. Cl.$^4$ .................. G03C 1/495; G03C 1/60
[52] U.S. Cl. .................. 430/191; 430/190; 430/192; 430/270; 430/272; 430/280; 430/914; 430/916; 430/919; 430/920; 430/925; 430/177
[58] Field of Search .............. 430/190, 191, 192, 270, 430/272, 280, 914, 916, 919, 920, 925, 177

[56] References Cited

U.S. PATENT DOCUMENTS

| 3,779,774 | 12/1973 | Cope et al. | 430/176 |
| 3,865,588 | 2/1975 | Ohto et al. | 430/278 |
| 3,953,212 | 4/1976 | Miyano et al. | 430/191 |
| 4,160,671 | 7/1979 | Stahlhofen | 430/191 |
| 4,208,471 | 6/1980 | Bresak et al. | 428/447 |
| 4,350,753 | 9/1982 | Shelnut et al. | 430/191 |
| 4,439,512 | 3/1984 | Ceintrey et al. | 430/180 |
| 4,458,000 | 7/1984 | Stahlhofen | 430/280 |
| 4,491,508 | 1/1985 | Olson et al. | 204/159.13 |
| 4,498,964 | 2/1985 | Husler et al. | 204/159.23 |
| 4,510,227 | 4/1985 | Mohr et al. | 430/270 |
| 4,537,854 | 8/1985 | Crivello | 430/283 |
| 4,584,260 | 4/1986 | Iwasaki et al. | 430/288 |
| 4,600,685 | 7/1986 | Kitakohji et al. | 430/270 |

FOREIGN PATENT DOCUMENTS

| 135621 | 11/1978 | Japan | 430/191 |
| 48045 | 3/1983 | Japan | 430/190 |
| 1367830 | 9/1974 | United Kingdom | 430/331 |
| 1514552 | 6/1978 | United Kingdom | 430/191 |

OTHER PUBLICATIONS

Research Disclosure #13147, 3/1975, pp. 52–55.

Primary Examiner—Charles L. Bowers, Jr.
Attorney, Agent, or Firm—Sughrue, Mion, Zinn, Macpeak and Seas

[57] ABSTRACT

A photosolubilizable composition contains both a compound capable of producing an acid by irradiation with actinic rays and a compound which has at least one silyl ether or silyl ester group capable of being decomposed by an acid; optionally, a compound having at least one silyl ether group has at least one hydrophilic group, providing for increased solubility in a developing solution under the action of an acid, thus enhancing the photosensitivity and the development latitude of the composition.

13 Claims, No Drawings

PHOTOSOLUBILIZABLE COMPOSITION

This is a continuation of application Ser. No. 625,079, filed June 27, 1984, now abandoned.

FIELD OF THE INVENTION

The present invention relates to a photosolubilizable composition suited for the production of lithographic printing plates, proofs for multicolor printing, drawings for overhead projectors, integrated circuits, and photomasks, and more particularly, to a novel photosolubilizable composition which contains a compound capable of producing an acid by irradiation with actinic rays and a compound having at least one silyl ether or ester group capable of being decomposed by an acid.

BACKGROUND OF THE INVENTION

As representative of photosensitive materials which can be solubilized by irradiation with actinic rays, that is to say, which can work positively, orthoquinonediazide compounds have so far been known, and in practice they have been widely used in lithographic printing plates, photoresists and so on. Such orthoquinonediazide compounds are described, for example, in U.S. Pat. Nos. 2,766,118, 2,767,092, 2,772,972, 2,859,112, 2,907,665, 3,046,110, 3,046,111, 3,046,115, 3,046,118, 3,046,119, 3,046,120, 3,046,121, 3,046,122, 3,046,123, 3,061,430, 3,102,809, 3,106,465, 3,635,709 and 3,647,443, and in a number of publications.

When irradiated with actinic rays, these orthoquinonediazide compounds decompose to produce carboxylic acids of 5-membered rings, whereby they become alkali-soluble. This property enables the orthoquinonediazide compounds to be used as positively working photosensitive materials. However, such orthoquinonediazide compounds have the defect that their photosensitivities are insufficient. This is because the quantum yield in the photochemical reaction of orthoquinonediazide compounds is essentially less than 1.

For the purpose of enhancing photosensitivities of photosensitive compositions containing orthoquinonediazide compounds, various methods have been attempted. However, it has been very difficult to increase the photosensitivities of such compositions, while retaining their development latitudes. For instance, such attempts are described in U.S. Pat. No. 3,661,582 (German Patent Application (OLS) No. 2,028,214), U.S. Pat. Nos. 4,009,003, 4,307,173 and so on.

Recently, some photosensitive compositions which can work positively without containing orthoquinonediazide compounds have been proposed. One of them, for example, contains a polymer compound having an orthonitrocarbinol ester group, as described in U.S. Pat. No. 3,849,137 (German Patent Application (OLS) No. 2,150,691). In this case also, however, the photosensitivity is insufficient for the same reason as in the case of an orthoquinonediazide. Aside from such a composition, there have been proposed photosensitive systems which can be activated by catalytic action. Therein, the photosensitivity can be enhanced by application of the principle that an acid produced upon photolysis brings about a second reaction, whereby the exposed portions are solubilized.

As examples of such photosensitive systems, mention may be made of a combination of a compound capable of producing an acid by photolysis with an acetal or O,N-acetal compound (U.S. Pat. No. 3,779,778), a combination of a compound capable of producing an acid upon photolysis with an orthoester or amidoacetal compound (U.S. Pat. No. 4,101,323), a combination of a compound capable of producing an acid by photolysis with a polymer having an acetal or ketal group in its main chain (U.S. Pat. No. 4,247,611), a combination of a compound capable of producing an acid by photolysis with an enol ether compound (U.S. Pat. No. 4,248,957), a combination of a compound capable of producing an acid by photolysis with an N-acyliminocarboxylic acid compound (U.S. Pat. No. 4,250,247), and a combination of a compound capable of producing an acid by photolysis with a polymer having an orthoester group in its main chain (U.S. Pat. No. 4,311,782). These combinations have the possibility of exhibiting high photosensitivities because they can have quantum yields of more than 1, in principle. However, in the case of the acetal or O,N-acetal compound, and in the case of the polymer having an acetal or ketal group in its main chain, the second reaction caused by the acid produced upon photolysis proceeds so slowly that photosensitivity high enough to be fit for practical use cannot be achieved. On the other hand, although photosensitivities attained are undoubtedly high in the cases or the orthoester or amidoacetal compound, the enol ether compound, and the N-acyliminocarboxylic acid compound, these compounds are poor in stability with a lapse of time and cannot be preserved for a long period of time. Further, the combination with the polymer having an orthoester group in its main chain, though highly photosensitive, suffers from the defect that its development latitude is rather narrow.

SUMMARY OF THE INVENTION

Therefore, a primary object of the present invention is to provide a novel photosolubilizable composition by which the above-described problems are solved. That is, it is a primary object to provide a novel photosolubilizable composition having high photosensitivity and exhibiting broad development latitude.

Another object of the present invention is to provide a novel photosolubilizable composition which is excellent in keeping properties (stability), and therefore can withstand long-term storage.

A further object of the present invention is to provide a novel photosolubilizable composition which can be obtained with ease using a simple preparation process.

As a result of extensive investigations, it has now been found that the above objects can be attained by using a novel photosolubilizable composition as described below, thus resulting in the present invention.

That is, the present invention comprises a photosolubilizable composition containing a first compound capable of producing an acid by irradiation with actinic rays and a second compound having at least one silyl ether or silyl ester group capable of being decomposed by an acid, selected from a Compound (a) and a Compound (b) whose solubility in a developing solution is increased due to the action of an acid, wherein the Compound (a) is a compound including at least one silyl ether group represented by formula (I):

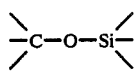

(I)

and the Compound (b) is a compound including at least one silyl ester group represented by formula (II):

aryl group containing from 6 to 15 carbon atoms; or $R_{15}$ and $R_{16}$ may combine with each other to form a part of an aliphatic or aromatic ring; $m_1$ and $n_1$ each represents a positive integer, preferably $m_1$ ranges from 1 to 1,000 and $n_1$ ranges from 1 to 500; and $a_1$ and $b_1$ each represents 0 or 1.

Compound (b) of the present invention includes compounds represented by formula (IIa) or (IIb):

$$R_{21}\left(\!\!\begin{array}{c}O\\\|\\C\end{array}\!\!-O-\!\!\begin{array}{c}R_{22}\\|\\Si\\|\\R_{23}\end{array}\!\!-R_{24}\right)_{m_2} \quad (IIa)$$

$$H\!\left(\!\!O-\!\!\begin{array}{c}R_{22}\\|\\Si\\|\\R_{23}\end{array}\!\!-O\right)_{\!a_2}\!\!\!-O-\!\!\begin{array}{c}O\\\|\\C\end{array}\!\!-R_{25}\!\!\left(\!\!\begin{array}{c}O\\\|\\C\end{array}\!\!-O-\!\!\begin{array}{c}R_{22}\\|\\Si\\|\\R_{23}\end{array}\!\!-O-\!\!\begin{array}{c}O\\\|\\C\end{array}\!\!-R_{26}\!\!\right)_{\!n_2}\!\!\!\begin{array}{c}O\\\|\\C\end{array}\!\!-O\!\!\left(\!\!\begin{array}{c}R_{22}\\|\\Si\\|\\R_{23}\end{array}\!\!-O\right)_{\!b_2}\!\!\!H \quad (IIb)$$

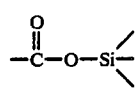

(II)

According to a preferred embodiment, Compound (a) is a Compound (c), having at least one silyl ether group of said formula (I) and at least one hydrophilic group. Of course, combinations of first compounds capable of providing an acid, and combinations of second compounds having at least one silyl ether or silyl ester group may also be used in accordance with the present invention.

DETAILED DESCRIPTION OF THE INVENTION

Compounds (a), (b), and (c), which have at least one silyl ether or ester group capable of being decomposed by an acid, by which the present invention is characterized, are illustrated in greater detail below.

Compound (a) of the present invention includes, in addition to Compound (c) as specifically described hereinafter, compounds represented by formula (Ia) or (Ib):

$$R_{11}\!\!\left(\!\!O-\!\!\begin{array}{c}R_{12}\\|\\Si\\|\\R_{13}\end{array}\!\!-R_{14}\right)_{\!m_1} \quad (Ia)$$

$$HO\!\!\left(\!\!\begin{array}{c}R_{12}\\|\\Si\\|\\R_{13}\end{array}\!\!-O\right)_{\!a_1}\!\!\!\left(R_{15}\!-O-\!\!\begin{array}{c}R_{12}\\|\\Si\\|\\R_{13}\end{array}\!\!-O\right)_{\!n_1}\!\!\!\left(R_{15}\!-O\right)_{\!b_1}\!\!H \quad (Ib)$$

wherein $R_{11}$ represents an $m_1$-valent aliphatic or aromatic hydrocarbon residue, which may be substituted; $R_{12}$, $R_{13}$, and $R_{14}$, which may be the same or different, each represents a hydrogen atom, an alkyl group, an alkenyl group, an aryl or aralkyl group which may be substituted, a halogen atom, or $-OR_{16}$, preferably an alkyl group containing from 1 to 4 carbon atoms, a chlorine atom or $-OR_{16}$, and more preferably an alkyl group containing from 1 to 4 carbon atoms or $-OR_{16}$; $R_{15}$ represents a divalent aliphatic or aromatic hydrocarbon residue, which may be substituted; $R_{16}$ represents an alkyl group, an aryl group, or an aralkyl group, each of which may be substituted, and preferably an alkyl group containing from 1 to 8 carbon atoms or an aryl group containing from 6 to 15 carbon atoms; or $R_{15}$ and $R_{16}$ may combine with each other to form a part of an aliphatic or aromatic ring; $m_1$ and $n_1$ each represents a positive integer, preferably $m_1$ ranges from 1 to 1,000 and $n_1$ ranges from 1 to 500; and $a_1$ and $b_1$ each represents 0 or 1.

wherein $R_{21}$ represents an $m_2$-valent aliphatic or aromatic hydrocarbon residue, which may be substituted; $R_{22}$, $R_{23}$, and $R_{24}$, which may be the same or different, each represents a hydrogen atom, an alkyl group, an alkenyl group, an aryl or aralkyl group which may be substituted, an alkoxy group, a halogen atom, or $$-O-\overset{\overset{\displaystyle O}{\|}}{C}-R_{27},$$

preferably an alkyl group containing from 1 to 4 carbon atoms, an alkoxy group containing from 1 to 8 carbon atoms, a chlorine atom or $$-O-\overset{\overset{\displaystyle O}{\|}}{C}-R_{27},$$

and more preferably an alkyl group containing from 1 to 4 carbon atoms or an alkoxy group containing from 1 to 8 carbon atoms; $R_{25}$ and $R_{26}$, which may be the same or different, each represents a divalent aliphatic or aromatic hydrocarbon residue, which may be substituted; $R_{27}$ represents an alkyl group, an aryl group, or an aralkyl group, each of which may be substituted; $m_2$ and $n_2$ each represents a positive integer, preferably $m_2$ ranges from 1 to 1,000 and $n_2$ ranges from 1 to 500; and $a_2$ and $b_2$ each represents 0 or 1.

Specific examples of the hydrophilic group which can be contained in Compound (c) of the present invention include the following:

$$+\!CH_2CH_2-O\!\!\xrightarrow{}_{\overline{n_3}},\ \ +\!(CH_2)_{\overline{l_3}}O\!\!\xrightarrow{}_{\overline{m_3}}\!+\!CH_2CH_2-O\!\!\xrightarrow{}_{\overline{n_3}},$$

$$+\!\!\underset{\underset{\displaystyle R_{31}}{|}}{CHCH_2}\!-O\!\!\xrightarrow{}_{\overline{m_3}}\!+\!CH_2CH_2-O\!\!\xrightarrow{}_{\overline{n_3}},\ \ +\!\!\underset{\underset{\displaystyle OH}{|}}{CH_2CHCH_2}\!-O\!\!\xrightarrow{}_{\overline{n_3}},$$

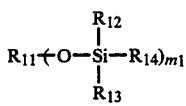, $+\!(CH_2)_{\overline{l_3}}O\!\!\xrightarrow{}_{\overline{n_3}}$, and $$+\!\!\underset{\underset{\displaystyle R_{31}}{|}}{CHCH_2}\!-O\!\!\xrightarrow{}_{\overline{n_3}}$$

wherein $l_3$ represents an integer of 1 to 4; $m_3$ and $n_3$ each represents an integer of 1 or more, preferably an integer of 1 to 100, and more preferably an integer of 1 to 20; and $R_{31}$ represents an alkyl group, or a phenyl group which may be substituted. Of these groups, particularly preferable hydrophilic groups are those represented by $-CH_2CH_2-O-_{n_3}$.

Compound (c) of the present invention, which has both a silyl ether group and a hydrophilic group, includes compounds represented by formulae (IIIa) and (IIIb):

4 carbon atoms, a chlorine atom or $-OR_{48}$, and more preferably an alkyl group containing from 1 to 4 carbon atoms or $-OR_{48}$; $R_{45}$ represents a divalent aliphatic or aromatic hydrocarbon residue which may be substituted; $R_{46}$ represents a divalent hydrophilic group; $R_{47}$ represents $R_{45}$ or $R_{46}$; $R_{48}$ represents an alkyl group, an aryl group or an aralkyl group, each of which may be substituted, and preferably an alkyl group containing from 1 to 8 carbon atoms or an aryl group containing from 6 to 15 carbon atoms, or $R_{48}$ may combine with $R_{45}$ and form a part of an aliphatic or aromatic ring; $n_{41}$, $$R_{41}(O-\underset{\underset{R_{43}}{|}}{\overset{\overset{R_{42}}{|}}{Si}}-R_{44})_{n_{41}} \quad (IIIa)$$

$$HO(\underset{\underset{R_{43}}{|}}{\overset{\overset{R_{42}}{|}}{Si}}-O)_{a_4}R_{47}-O-\underset{\underset{R_{43}}{|}}{\overset{\overset{R_{42}}{|}}{Si}}-O((R_{45}-O-\underset{\underset{R_{43}}{|}}{\overset{\overset{R_{42}}{|}}{Si}}-O)_{\overline{n_{42}}}(R_{46}-O-\underset{\underset{R_{43}}{|}}{\overset{\overset{R_{42}}{|}}{Si}}-O)_{\overline{n_{43}}})_{n_{44}}R_{47}-O(\underset{\underset{R_{43}}{|}}{\overset{\overset{R_{42}}{|}}{Si}}-O)_{\overline{b_4}}H \quad (IIIb)$$

In the foregoing formulae (IIIa) and (IIIb), $R_{41}$ represents an $n_{41}$-valent aliphatic or aromatic hydrocarbon residue which has a hydrophilic group, and which may be further substituted; $R_{42}$, $R_{43}$, and $R_{44}$, which may be the same or different, each represents a hydrogen atom, an alkyl group, an alkenyl group, an aryl or aralkyl group which may be substituted, a halogen atom or $-OR_{48}$, preferably an alkyl group containing from 1 to $n_{42}$, $n_{43}$ and $n_{44}$ each represents a positive integer, and preferably $n_{41}$ ranges from 1 to 1,000, and $n_{42}$, $n_{43}$ and $n_{44}$ each ranges from 1 to 500; and $a_4$ and $b_4$ each represents 0 or 1.

Specific examples of Compounds (a) to (c) which can be employed in the present invention are illustrated below.

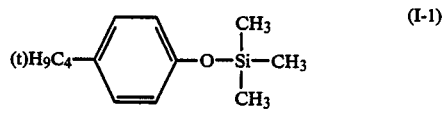
(I-1)

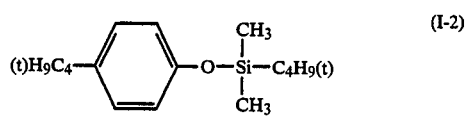
(I-2)

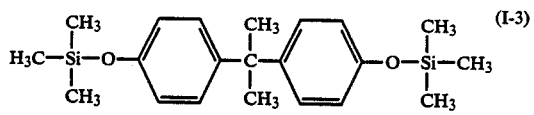
(I-3)

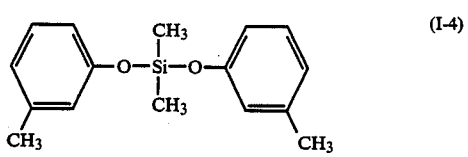
(I-4)

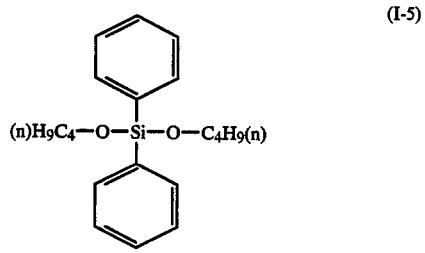
(I-5)

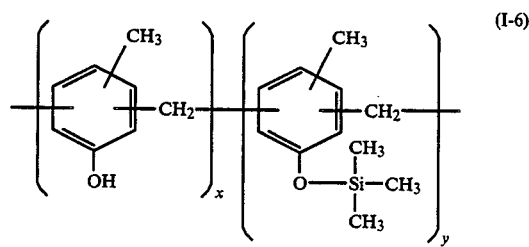
(I-6)

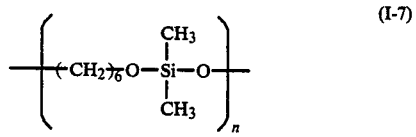
(I-7)

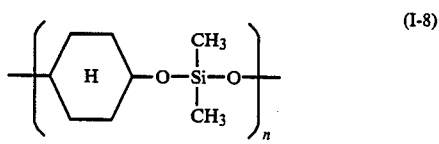
(I-8)

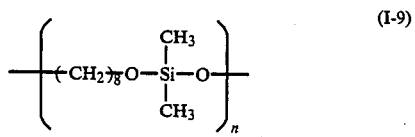
(I-9)

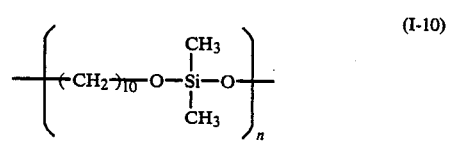
(I-10)

-continued
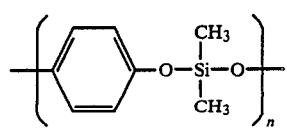 (I-11)
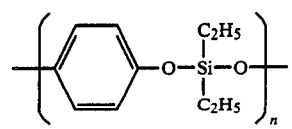 (I-12)
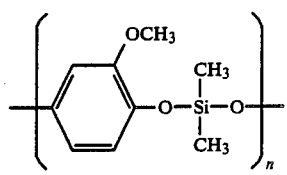 (I-13)
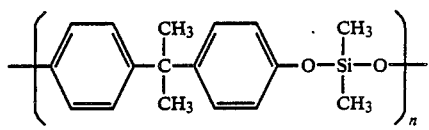 (I-14)
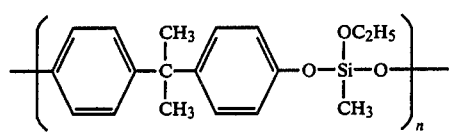 (I-15)
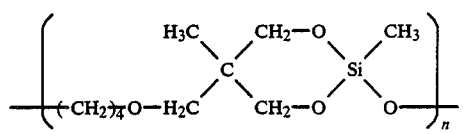 (I-16)
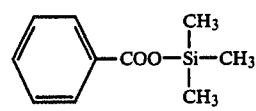 (II-1)
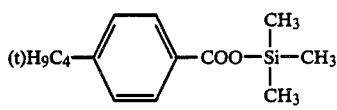 (II-2)
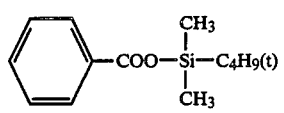 (II-3)
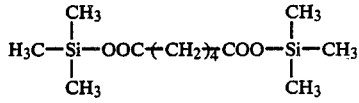 (II-4)
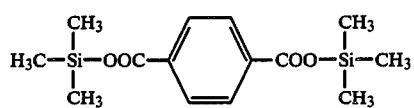 (II-5)
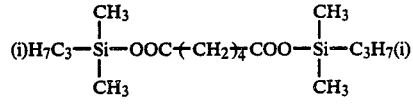 (II-6)
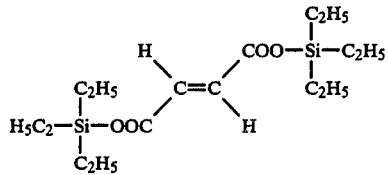 (II-7)
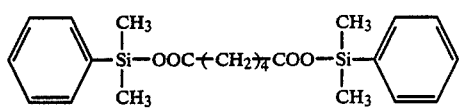 (II-8)
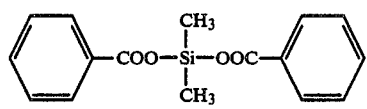 (II-9)
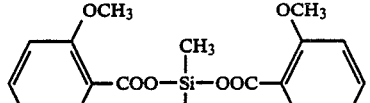 (II-10)
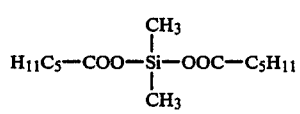 (II-11)
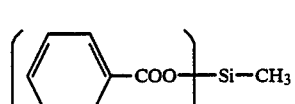 (II-12)
 (II-13)
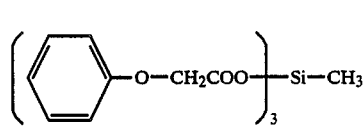 (II-14)
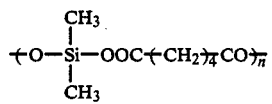 (II-15)
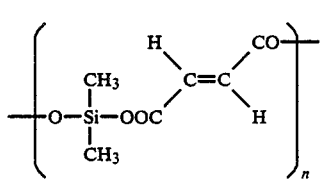 (II-16)

-continued
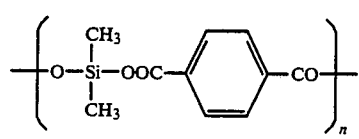 (II-17)
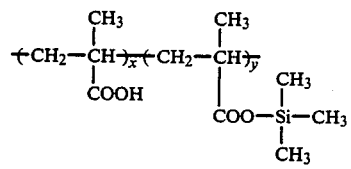 (II-18)
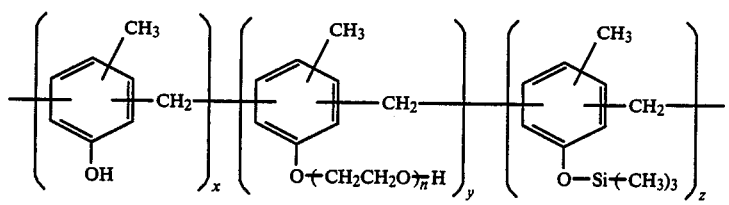 (III-1)
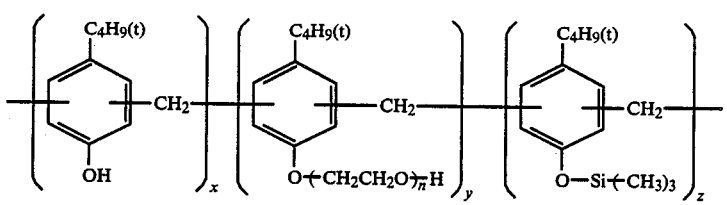 (III-2)
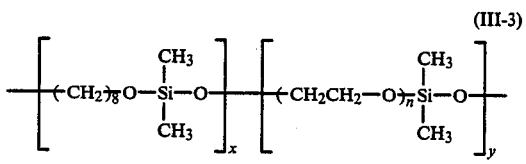 (III-3)
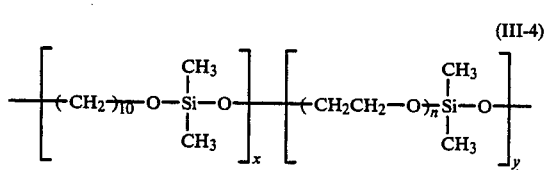 (III-4)
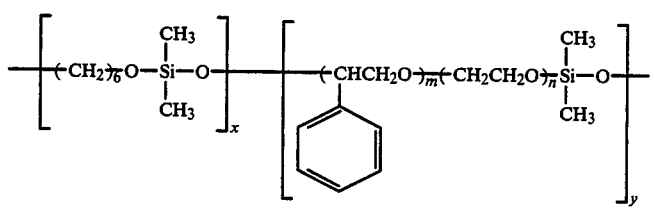 (III-5)
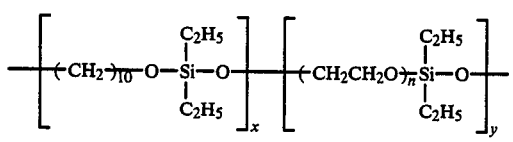 (III-6)
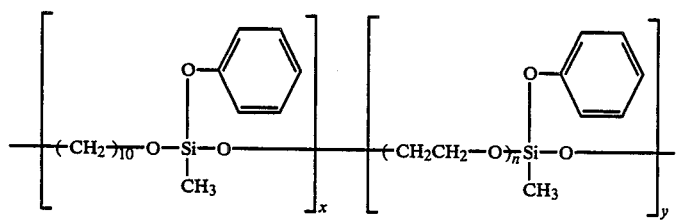 (III-7)
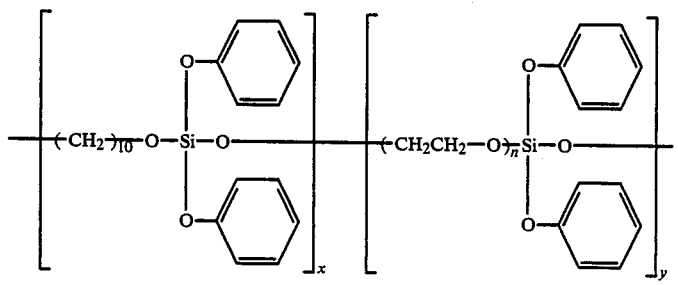 (III-8)

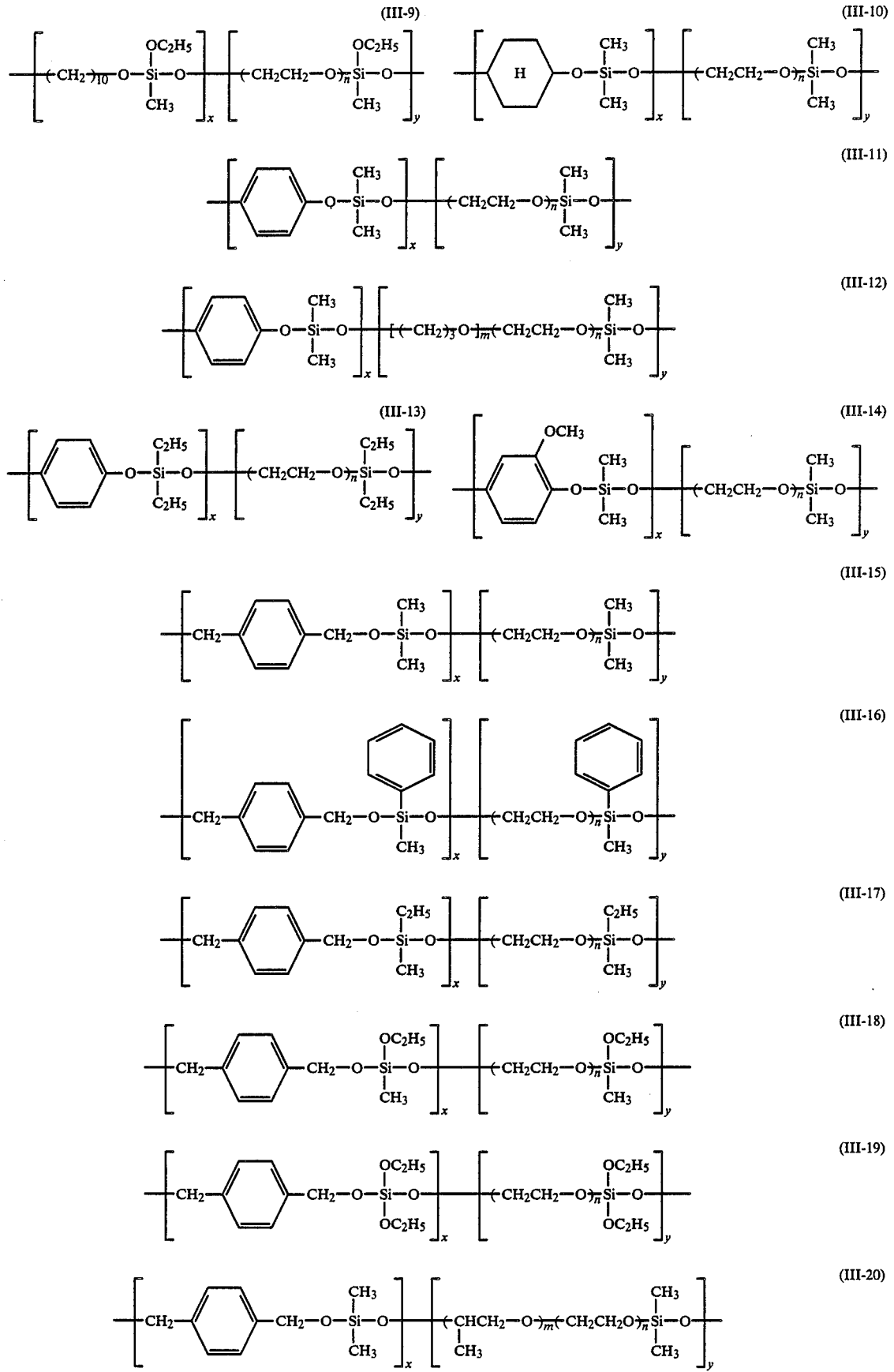

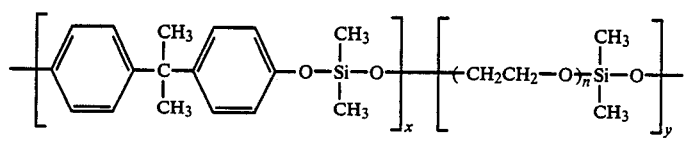
(III-21)
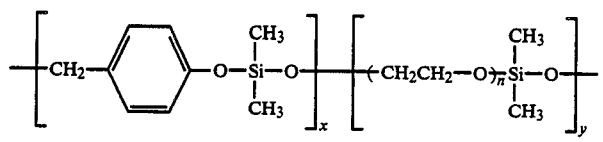
(III-22)
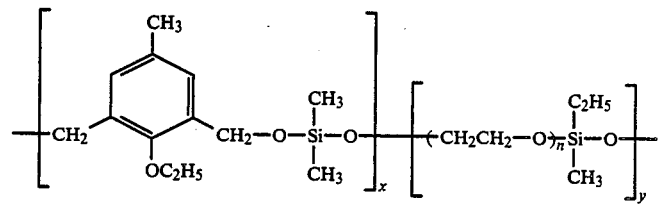
(III-23)
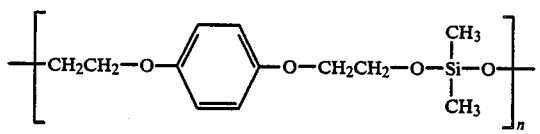
(III-24)
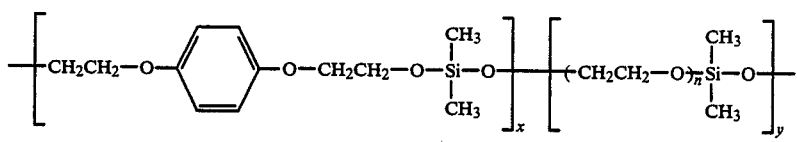
(III-25)
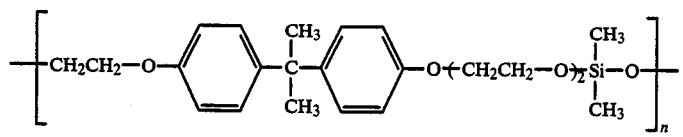
(III-26)
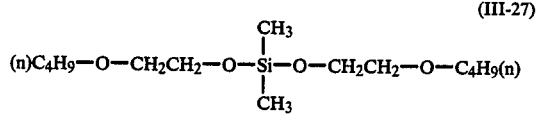
(III-27)
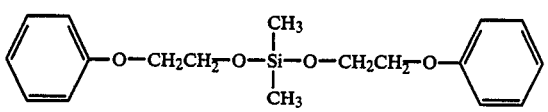
(III-28)
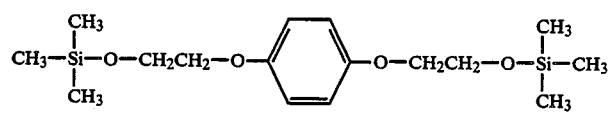
(III-29)
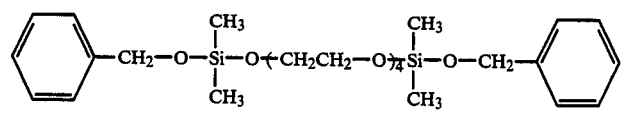
(III-30)
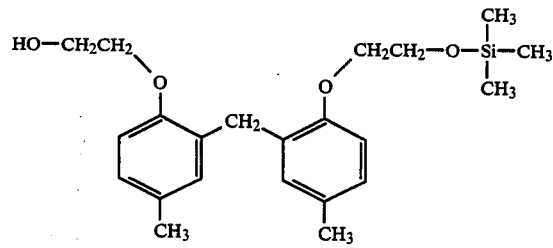
(III-31)
In the foregoing formulae, x, y and z each represents a molar ratio. When the compound contains three components, x ranges from 0 to 90 mole%, y from 5 to 95 mole%, and z from 5 to 95 mole%. When the compound contains two components, x ranges from 0 to 95 mole%, and y ranges from 5 to 100 mole%. In addition, m and n each represents an integer of 1 or above.

Suitable examples of compounds capable of producing an acid by irradiation with actinic rays which can be employed in combination with the above-illustrated compounds having a silyl ether group or a silyl ester group capable of being decomposed by an acid include various known compounds and mixtures. Specifically, diazonium, phosphonium, sulfonium and iodonium salts of $BF_4^-$, $PF_6^-$, $SbF_6^-$, $SiF_6^{2-}$, $ClO_4^-$ or so on, organic halogen compounds, orthoquinonediazidosulfonyl chloride, and combinations of organometallic compounds and organic halogen compounds are preferably employed. Compounds capable of producing acids upon photolysis as described in U.S. Pat. No. 3,779,778 and German Pat. No. 2,610,842 are also suitable to be used as the acid-providing constituent of the present invention. Furthermore, compounds which are intended to provide a visible contrast between the unexposed portion and the exposed portion upon exposure when used in combination with an appropriate dye, as described in U.S. Pat. Nos. 4,279,982 and 4,399,210, can be also employed as the acid-providing constituent of the present invention.

Of the above-described compounds which can produce acids by photolysis, orthoquinonediazidosulfonyl chloride, s-triazine derivatives which are substituted by a halomethyl group, and oxadiazole derivatives which are substituted by a halomethyl group are particularly preferred. Taking the case of orthoquinonediazidosulfonyl chloride, this is because three acid groups (viz., hydrochloric acid, sulfonic acid, and carboxylic acid) are produced upon exposure, whereby the above-described silyl ether groups or silyl ester groups can be decomposed in comparatively large proportions.

These compounds which can produce acids by irradiation with actinic rays and the above-described compound having at least one silyl ether or silyl ester group which can be decomposed by acids are used in a ratio, with respect to the compounds having at least one silyl ether or silyl ester group, ranging from 0.001/1 to 2/1, and preferably from 0.02/1 to 0.8/1, by weight.

Although the photosolubilizable composition of the present invention can be constituted wholly by the combination of the above-described compound(s) capable of producing acids by irradiation with actinic rays and the above-described compound(s) having at least one silyl ether or ester group capable of being decomposed by acids, the first and second compounds are preferably used with alkali-soluble resins. Preferred alkali-soluble resins which can be used for this purpose include novolak type phenol resins, with specific examples including phenol-formaldehyde resin, o-cresol-formaldehyde resin, m-cresol-formaldehyde resin, and the like. When condensates of phenols or cresols substituted by an alkyl group containing from 3 to 8 carbon atoms and formaldehyde (such as t-butylphenol-formaldehyde resin) are used together with the above-described phenol resins, more desirable results can be obtained. Such an alkali-soluble resin as described above can be added in an amount of about 40 to 90 wt%, preferably 60 to 80 wt%, based on the total weight of the photosensitive resist-forming composition.

In addition, the photosolubilizable composition of the present invention can optionally contain dyes, pigments, plasticizers, compounds capable of increasing the acid-producing efficiency of the above-described compound which can produce acids (so-called sensitizers), and so on. Suitable dyes which can be used are oil-soluble dyes and basic dyes, with specific examples including Oil Yellow #101, Oil Yellow #130, Oil Pink #312, Oil Green BG, Oil Blue BOS, Oil Blue #603, Oil Black BY, Oil Black BS, Oil Black T-505 (the foregoing are products of Orient Chemical Industries., Ltd.), Crystal Violet (CI 42555), Methyl Violet (CI 42535), Rhodamine B (CI 45170B), Malachite Green (CI 42000), Methylene Blue (CI 52015) and so on.

The photosolubilizable composition of the present invention is dissolved in a solvent which can dissolve therein all of the above-described components, and coated on a support. Suitable examples of solvents which can be employed herein include ethylene dichloride, cyclohexanone, methyl ethyl ketone, ethylene glycol monomethyl ether, ethylene glycol monoethyl ether, 2-methoxyethyl acetate, toluene, methyl acetate and so on. These solvents may be used individually or in a mixture of two or more thereof. A preferable concentration range for the solid components (including additives) in such a solvent is from 2 to 50 wt%. As for the constituents essential to the present invention, a desirable concentration thereof is from 0.1 to 25 wt%.

The desirable coverage of the composition of the present invention varies depending on its end use. For example, when applied to a presensitized printing plate, the preferable coverage of the composition (as solid component) is from 0.5 to 3.0 g/m². Although the photosensitivity is increased with a decrease in coverage, the physical properties of the photosensitive film are deteriorated.

Suitable examples of the support which can be employed in producing a lithographic printing plate using the photosolubilizable composition of the present invention include an aluminum plate which has received a treatment to render its surface hydrophilic, such as a silicate-processed aluminum plate, an anodically oxidized aluminum plate, a grained aluminum plate and a silicate-electrodeposited aluminum plate; a zinc plate; a stainless steel plate; a chromium-processed steel plate; a plastic film whose surface has been rendered hydrophilic; and a sheet of paper.

Suitable examples of the support which can be employed in producing proofs for printing and films for a second original used in an overhead projector include transparent plastic films such as a polyethylene terephthalate film, a triacetate film, etc., including such films which have chemically or physically matted surfaces. Suitable examples of the support which can be employed in producing photomask films include an aluminum-, aluminum alloy- or chromium-vapor deposited polyethylene terephthalate film and a polyethylene terephthalate film on which a colored layer has been provided. Further, in producing a photoresist, the photosolubilizable composition of the present invention can be coated on various kinds of supports other than those described above, such as, for example, a copper plate, a copper-plated plate, or a glass plate.

Examples of the light source of actinic rays which can be employed in the present invention include a mercury vapor lamp, a metal halide lamp, a xenon lamp, a chemical lamp, a carbon arc lamp, etc. In addition, scanning irradiation with high energy beams (laser beams and electron beams) can be employed in the present invention. Suitable laser beams which can be employed for this purpose include a helium-neon laser, an argon laser, a krypton laser, a helium-cadmium laser, and so on.

An appropriate developing solution for the photosolubilizable composition of the present invention is an aqueous solution of an inorganic alkali agent such as sodium silicate, potassium silicate, sodium hydroxide, potassium hydroxide, lithium hydroxide, sodium tertiary phosphate, sodium secondary phosphate, ammonium tertiary phosphate, ammonium secondary phosphate, sodium metasilicate, sodium bicarbonate, ammonia water, etc., and such an alkali agent is used in a concentration of from 0.1 to 10 wt%, and preferably from 0.5 to 5 wt%, based on the weight of the developing solution.

Further, the above-described alkaline aqueous solution can optionally contain a surface active agent and an organic solvent, e.g., alcohols.

The present invention will now be illustrated in more detail by reference to the following synthesis examples and examples. However, the present invention should not be construed as being limited to these examples.

SYNTHESIS EXAMPLE 1

Synthesis of Compound (I-1)

In 70 ml of pyridine was dissolved 15.1 g (0.101 mole) of p-tert-butylphenol. To the solution were added successively 7.8 g (0.048 mole) of hexamethyldisilazane and 2.6 g (0.024 mole) of trimethylchlorosilane through a dropping funnel at room temperature with stirring over 15 minutes. Thereafter, the stirring was continued for 5 hours at room temperature. The resulting white salt (ammonium chloride and/or pyridine hydrochloride) was filtered out, and the pyridine solution was concentrated under reduced pressure. The thus obtained colorless transparent liquid was vacuum distilled using a Vigreux-Claisen column. Thus, 16.4 g of a colorless transparent liquid having a boiling point of 67° C. (at 0.4 mmHg) was obtained. The structure of this liquid was identified as that of Compound (I-1) by NMR measurement and elemental analysis.

SYNTHESIS EXAMPLE 2

Synthesis of Compound (I-6)

In 70 ml of pyridine was dissolved 12.1 g (0.101 mole) of m-cresol-formaldehyde novolak resin. To the solution were added successively 7.8 g (0.048 mole) of hexamethyldisilazane and 2.6 (0.024 mole) of trimethylchlorosilane through a dropping funnel at room temperature with stirring over 15 minutes. Thereafter, the stirring was continued for 5 hours at room temperature. The resulting white salt (ammonium chloride and/or pyridine hydrochloride) was filtered out, and the pyridine solution was concentrated under reduced pressure. The thus obtained brown viscous liquid was dissolved in 20 ml of methyl ethyl ketone, and the resulting solution was poured into 700 ml of hexane with stirring. 18 g of a grayish brown powder was obtained by carrying out filtration and subsequent drying. The structure of this powder was identified as that of Compound (I-6) by NMR measurement and elemental analysis.

SYNTHESIS EXAMPLE 3

Synthesis of Compound (II-1)

12.2 g of benzoic acid was dissolved in 100 ml of pyridine, and 7.8 g of hexamethyldisilazane was added thereto through a dropping funnel at room temperature with stirring over 10 minutes. Subsequently, 2.6 g of trimethylchlorosilane was further added thereto over 5 minutes. Thereafter, the stirring was continued for 5 hours at room temperature. The resulting white salt (ammonium chloride and/or pyridine hydrochloride) was filtered out, and the pyridine solution was concentrated under reduced pressure. The thus obtained colorless transparent liquid was vacuum distilled using a Vigreux-Claisen column. Thus, 16.6 g of a colorless transparent liquid having a boiling point of 60° C. (at 0.3 mmHg) was obtained. The structure of this liquid was identified as that of Compound (II-1) by NMR measurement and elemental analysis.

SYNTHESIS EXAMPLE 4

Synthesis of Compound (II-4)

In 120 ml of pyridine was dissolved 14.6 g of adipic acid. To the solution was added 15.6 g of hexamethyldisilazane through a dropping funnel at room temperature with stirring over 20 minutes. Subsequently, 5.2 g of trimethylchlorosilane was further added thereto over 10 minutes. Thereafter, the stirring was continued for 5 hours at room temperature. The resulting white salt (ammonium chloride and/or pyridine hydrochloride) was filtered out, and the pyridine solution was concentrated under reduced pressure. The thus obtained colorless transparent liquid was vacuum distilled using a Vigreux-Claisen column. Thus, 24.7 g of a colorless transparent liquid having a boiling point of 88° C. (at 0.17 mmHg) was obtained. The structure of this liquid was identified as that of Compound (II-4) by NMR measurement and elemental analysis.

SYNTHESIS EXAMPLE 5

Synthesis of Compound (III-3)

A solution of 12.9 g (0.100 mole) of dichlorodimethylsilane in 20 ml of toluene was added to a mixture of 7.32 g (0.501 mole) of 1,8-octanediol, 9.71 g (0.0500 mole) of tetraethylene glycol, 17.4 g (0.220 mole) of pyridine and 80 ml of dehydrated and distilled toluene through a dropping funnel with stirring and under cooling with ice over 30 minutes. Thereafter, the stirring was further continued at 50° C. for 5 hours. The resulting white salt (pyridine hydrochloride) was filtered out, and the toluene solution was concentrated under reduced pressure. Thereafter, the concentrate was dried by heating at about 80° C. under vacuum (about 1 mmHg) for 10 hours. Thus, 20.7 g of a colorless transparent liquid was obtained, and the structure thereof was identified at that of Compound (III-3) by NMR measurement. In addition, the number average molecular weight ($\overline{Mn}$) of this liquid determined by measurement with a vapor pressure osmometer was 1,980.

SYNTHESIS EXAMPLE 6

Synthesis of Compound (III-4)

21.5 g of a colorless transparent liquid was obtained in the same manner as in Synthesis Example 5 except that 8.72 g (0.0500 mole) of 1,10-decanediol was used in place of the 1,8-octanediol. The structure of this liquid was identified as that of Compound (III-4) by NMR measurement, and the number average molecular weight ($\overline{Mn}$) thereof determined by measurement with a vapor pressure osmometer was 1,850.

EXAMPLE 1

A 0.24 mm thick 2S aluminum plate was degreased by dipping for 3 minutes in a 10% aqueous solution of sodium tertiary phosphate maintained at 80° C., and grained with a nylon brush. Further, the aluminum plate was etched for about 10 seconds with sodium aluminate, and then subjected to a desmutting treatment with a 3% aqueous solution of sodium hydrogensulfate. The resulting aluminum plate was anodically oxidized for 2 minutes in 20% sulfuric acid by passing therethrough an electric current having a density of 2 A/dm$^2$ to prepare a base plate for a presensitized plate.

Five kinds of photosensitive solutions (A)-1 to (A)-5, which had the same composition (A) described below except that different compounds of the present invention were used in the various solutions, were prepared. Each of the photosensitive solutions was coated on the anodically oxidized aluminum plate, and dried at 100° C. for 2 minutes. Thus, presensitized printing plates (A)-1 to (A)-5 were obtained. Therein, the dry coverage of each photosensitive coating was 1.5 g/m$^2$.

The compounds of the present invention used in the photosensitive solutions (A)-1 to (A)-5 are set forth in Table 1.

| Photosensitive Composition (A): | |
|---|---|
| Compound of the Present Invention | 0.31 g |
| Cresol-Formaldehyde Novolak Resin | 1.0 g |
| 1,2-Naphthoquinone-2-diazido-4-sulfonyl Chloride | 0.05 g |
| Oil Blue #603 (produced by Orient Chemical Industries., Ltd.) | 0.01 g |
| Ethylene Dichloride | 10 g |
| Methyl Cellosolve | 10 g |

For the purpose of comparison, a presensitized printing plate (B)-1 was prepared by coating the following photosensitive composition (B) in the same manner as employed for the photosensitive solution (A).

| Photosensitive Composition (B): | |
|---|---|
| Condensate of Phenol-Formaldehyde Novolak Resin and 1,2-Naphthoquinone-2-diazido-5-sulfonyl Chloride | 0.45 g |
| Cresol-Formaldehyde Novolak Resin | 1.0 g |
| 1,2-Naphthoquinone-2-diazido-4-sulfonyl Chloride | 0.02 g |
| Oil Blue #603 (produced by Orient Chemical Industries., Ltd.) | 0.01 g |
| Ethylene Dichloride | 10 g |
| Methyl Cellosolve | 10 g |

The dry coverage of this photosensitive coating was 1.5 g/m$^2$. A gray scale having a density difference of 0.15 was placed in close contact with the photosensitive layer surface of each presensitized printing plate prepared, and was exposed by means of a carbon arc lamp of 30 ampere placed at a distance of 70 cm.

In order to prove superiority of the composition of the present invention in photosensitivity, each of the thus exposed presensitized printing plates (A)-1 to (A)-5 and (B)-1 was subjected to dip development in a 1/12 aqueous solution of DP-3B( trade name; developer product of Fuji Photo Film Co., Ltd.) at 25° C. for 60 seconds, and an exposure time at which the area corresponding to the fifth step of the gray scale having a density difference of 0.15 became completely clear was determined. The results obtained are shown in Table 1.

TABLE 1

| Presensitized Printing Plate | Compound Used | Exposure Time (sec) |
|---|---|---|
| (A)-1 | Compound (I-6) | 45 |
| (A)-2 | Compound (I-8) | 30 |
| (A)-3 | Compound (I-9) | 18 |
| (A)-4 | Compound (I-11) | 28 |
| (A)-5 | Compound (I-14) | 42 |
| (B)-1 | Comparison | 65 |

Every compound of the present invention in Table 1, Compounds (I-6), (I-8), (I-9), (I-11) and (I-14), had a number average molecular weight ($\overline{Mn}$) ranging from 1,400 to 2,000. In addition, the ratio of x to y in Compound (I-6) was 60/40 by mole.

As can be seen from Table 1, the presensitized printing plates (A)-1 to (A)-5 in which the compounds of the present invention were used had shorter exposure times than the presensitized printing plate (B)-1 prepared for comparison, that is, had higher photosensitivities.

EXAMPLE 2

Photosensitive solutions (A)-6 to (A)-9 were prepared in the same manner as in Example 1 except that the compounds set forth in Table 2 were used as the compound of the present invention in the photosensitive composition (A), and coated in the same manner as in Example 1 to prepare presensitized printing plates (A)-6 to (A)-9, respectively.

For the purpose of comparison, a presensitized printing plate (B)-2 was prepared in the same manner as in Example 1 except that a condensate of cresol-formaldehyde resin and 1,2-naphthoquinone-2-diazido-5-sulfonyl chloride was used in place of the condensate of phenol-formaldehyde novolak resin and 1,2-naphthoquinone-2-diazido-5-sulfonyl chloride in the photosensitive composition (B).

The exposure time of each of the thus prepared printing plates was determined in the same manner as in Example 1, and the results obtained are shown in Table 2.

TABLE 2

| Presensitized Printing Plate | Compound Used | Exposure Time (sec) |
|---|---|---|
| (A)-6 | Compound (II-1) | 27 |
| (A)-7 | Compound (II-4) | 15 |
| (A)-8 | Compound (II-9) | 22 |
| (A)-9 | Compound (II-16) | 32 |
| (B)-2 | Comparison | 80 |

Compound (II-16) of the present invention in Table 2 had a number average molecular weight ($\overline{Mn}$) of 1,040.

As can be seen from Table 2, a shorter exposure time was enough in the case of the presensitized printing plates of the present invention, (A)-6 to (A)-9, compared with the case of the presensitized plate (B)-2. That is, the presensitized plates of the present invention had higher photosensitivities than the comparative presensitized plate.

EXAMPLE 3

Presensitized printing plates of the present invention, (A)-10 to (A)-15, and a presensitized plate for comparison, (B)-3, were prepared in the same manner as in Example 1 except that the following photosensitive composition (A), wherein different compounds of the present invention were used in the solutions, and the following photosensitive composition (B) were used, in place of the photosensitive composition (A) and the photosensitive composition (B), respectively. An exposure time of each plate was determined in the same manner as in Example 1 except that a 1/10 aqueous solution of DP-3B was used as the developing solution. The results obtained are shown in Table 3.

| Photosensitive Composition (A): | |
|---|---|
| Compound of the Present Invention | 0.40 g |
| Cresol-Formaldehyde Novolak Resin | 1.1 g |
| 2-(p-Methoxyphenyl)-4,6-trichloromethyl-s-triazine | 0.05 g |
| Oil Blue #603 (produced by Orient Chemical Industries., Ltd.) | 0.01 g |
| Ethylene Dichloride | 10 g |
| Methyl Cellosolve | 10 g |
| Photosensitive Composition (B): | |
| Condensate of Cresol-Formaldehyde Novolak Resin and 1,2-Naphthoquinone-2-diazido-5-sulfonyl Chloride | 0.45 g |
| Cresol-Formaldehyde Novolak Resin | 1.1 g |
| 1,2-Naphthoquinone-2-diazido-4-sulfonyl Chloride | 0.02 g |
| Oil Blue #603 (produced by Orient Chemical Industries., Ltd.) | 0.01 g |
| Ethylene Dichloride | 10 g |
| Methyl Cellosolve | 10 g |

TABLE 3

| Presensitized Printing Plate | Compound Used | Exposure Time (sec) |
|---|---|---|
| (A)-10 | Compound (III-4) | 15 |
| (A)-11 | Compound (III-10) | 20 |
| (A)-12 | Compound (III-14) | 18 |
| (A)-13 | Compound (III-15) | 13 |
| (A)-14 | Compound (III-21) | 38 |
| (A)-15 | Compound (III-24) | 45 |
| (B)-3 | Comparison | 55 |

The compounds of the present invention in Table 3, (III-4), (III-10), (III-14), (III-15) and (III-21), had the same x/y ratio of 50/50 (by mole), and all of the compounds of the present invention had a number average molecular weight ($\overline{Mn}$) in the range of 1,600 to 2,100.

As can be seen from Table 3, all of the presensitized printing plates of the present invention, (A)-10 to (A)-15, had shorter exposure times, that is, higher photosensitivities, than the comparative presensitized printing plate (B)-3.

EXAMPLE 4

Four kinds of presensitized printing plates (C)-1 to (C)-4 were prepared in the same manner as in Example 1 except that four photosensitive solutions (C)-1 to (C)-4, which had the same composition as the following photosensitive composition (C) except that they contained different kinds of compounds as the constituent capable of producing acids by irradiation with actinic rays, were used, respectively.

| Photosensitive Composition (C): | |
|---|---|
| Compound (I-13) of the Present Invention | 0.31 g |
| Cresol-Formaldehyde Novolak Resin | 1.0 g |
| Compound Capable of Producing Acids by Irradiation with Actinic Rays | 0.05 g |
| Oil Blue (produced by Orient Chemical Industries., Ltd.) | 0.01 g |

-continued

| Photosensitive Composition (C): | |
|---|---|
| Ethylene Dichloride | 10 g |
| Methyl Cellosolve | 10 g |

The dry coverage in all of the presensitized printing plates prepared was 1.5 g/m$^2$. Compounds capable of producing acids by irradiation with actinic rays which were employed in the photosensitive solutions (C)-1 to (C)-4 respectively are described in Table 4. A gray scale having a density difference of 0.15 was placed in close contact with the photosensitive layer surface of each presensitized printing plate prepared, and it was also placed in close contact with the photosensitive layer surface of the presensitized printing plate (B)-1 prepared in Example 1. Each of them was exposed by means of a carbon arc lamp of 30 ampere placed at a distance of 70 cm.

Each of the thus exposed presensitized printing plates (C)-1 to (C)-4 and (B)-1 was subjected to dip development in a ⅛ aqueous solution of DP-3B at 25° C. for 60 seconds, and an exposure time at which the area corresponding to the fifth step of the gray scale having a density difference of 0.15 became completely clear was determined. The results obtained are shown in Table 4.

TABLE 4

| Presensitized Printing Plate | Compound Capable of Producing Acids by Irradiation with Actinic Rays | Exposure Time (sec) |
|---|---|---|
| (C)-1 | 2-(p-Methoxyphenyl)-4,6-trichloromethyl-s-triazine | 38 |
| (C)-2 | 2-Trichloromethyl-5-(p-methoxystyryl)-1,3,4-oxadiazole | 52 |
| (C)-3 | 4-Diazo-diphenylamine Hexafluorophosphate | 25 |
| (C)-4 | N—(1,2-Naphthoquinone-2-diazido-4-sulfonyloxy)-phthalic Acid Imide | 38 |
| (B)-1 | Comparison | 60 |

Making additional remark, the number average molecular weight of Compound (I-13) of the present invention employed in the photosensitive composition (C) was 1,240.

As can be seen from Table 4, the exposure time was shorter in all of the presensitized printing plates (C)-1 to (C)-4, wherein the compounds of the present invention were employed, than in the presensitized printing plate (B)-1. That is, the presensitized printing plates of the present invention had higher photosensitivities than the comparative presensitized printing plate.

EXAMPLE 5

Photosensitive solutions (D)-1 and (D)-2 were prepared by adding 0.004 g of 9-phenylacridine and the same amount of Michler's ketone, respectively, to the photosensitive solution (C)-2 prepared in Example 4. The dry coverage of each photosensitive coating was 1.5 g/m$^2$.

The presensitized printing plates (C)-2, (D)-1, (D)-2 and (B)-1, respectively, were subjected to exposure and development processing in the same manner as in Example 4, and the exposure time at which the area corresponding to the fifth step of the gray scale having a density difference of 0.15 became completely clear was determined on each presensitized printing plate. The results obtained are shown in Table 5.

TABLE 5

| Presensitized Printing Plate | Additive (sensitizer) | Exposure Time (sec) |
|---|---|---|
| (C)-2 | Nil | 52 |
| (D)-1 | 9-Phenylacridine | 35 |
| (D)-2 | Michler's Ketone | 45 |
| (B)-1 | Comparison | 60 |

As can be seen from Table 5, photosensitivities of the presensitized printing plates (D)-1 and (D)-2 wherein the compounds of the present invention were used respectively were further increased by combined use of the compound capable of producing acids by irradiation with actinic rays and sensitizers as described above.

EXAMPLE 6

Presensitized printing plates were preapred in the same manner as in Example 1 except that compounds set forth in Table 6 respectively were used in place of the compound of the present invention contained in the photosensitive composition (A) of Example 1. In order to evaluate development latitude, the presensitized printing plate (B)-1 prepared in Example 1 and the presensitized printing plate (B)-2 prepared in Example 2 were employed in addition to the plates prepared herein for the purpose of comparison, and on the photosensitive layer of each of these plates was placed a gray scale having a density difference of 0.15 in close contact with each other, followed by exposure to light emitted from a carbon arc lamp of 30 ampere placed at a distance of 70 cm over 30 seconds. Subsequently, each of the exposed plates was subjected to dip development in the same developing solution as used in Example 1 at 25° C. One portion thereof was dipped for 60 seconds and the other was dipped for 3 minutes. A difference in step number of the gray scale having a density difference of 0.15 at which the corresponding area became completely clear between the case of 60 seconds' development and the case of 3 minutes' development was determined. The results obtained are shown in Table 6.

TABLE 6

| Presensitized Printing Plate | Compound Used | Difference in Step Number of Gray Scale between Areas Cleared by 3 Minutes' and 60 Seconds' Developments Respectively (step) |
|---|---|---|
| (A)-1 | Compound (I-6) | 1.0 |
| (A)-16 | Compound (I-10) | 2.0 |
| (A)-17 | Compound (I-12) | 1.5 |
| (A)-9 | Compound (II-16) | 1.5 |
| (A)-18 | Compound (II-6) | 1.5 |
| (A)-19 | Compound (II-10) | 1.5 |
| (A)-20 | Compound (II-17) | 1.0 |
| (B)-1 | Comparison | 2.5 |
| (B)-2 | Comparison | 2.0 |

The compounds of the present invention set forth in Table 6, (I-6), (I-10), (I-12), (II-16), and (II-17), had number average molecular weights ranging from 1,100 to 1,800. In addition, the x/y ratio of the compound (I-6) was 60/40 by mole.

As can be seen from Table 6, the presensitized printing plates prepared using the compounds of the present invention had small differences in the gray scale step number corresponding to the cleared area; that is, they were excellent in development latitude.

EXAMPLE 7

Presensitized printing plates were prepared in the same manner as in Example 3 except that compounds set forth in Table 7 respectively were used in place of the compound of the present invention contained in the photosensitive composition (A) of Example 3. In order to examine development latitude, these plates together with the plate (B)-3 prepared in Example 3 were processed in the same manner as in Example 6 except that a 1/10 aqueous solution of DP-3B was used as the developing solution, and the difference in the step number at which the corresponding area became clear was determined. The results obtained are shown in Table 7.

TABLE 7

| Presensitized Printing Plate | Compound Used | Difference in Step Number of Gray Scale between Areas Cleared by 3 Minutes' and 60 Seconds' Developments Respectively (step) |
|---|---|---|
| (A)-10 | Compound (III-4) | 1.5 |
| (A)-11 | Compound (III-10) | 1.5 |
| (A)-13 | Compound (III-15) | 1.0 |
| (A)-21 | Compound (III-17) | 1.0 |
| (A)-22 | Compound (III-23) | 1.0 |
| (A)-23 | Compound (III-25) | 1.5 |
| (B)-3 | Comparison | 2.0 |

The compounds of the present invention set forth in Table 7, (III-4), (III-10), (III-15), (III-17), (III-23) and (III-25), had an x/y ratio of 50/50 and an integer n of 4 in their respective structures. In addition, they had molecular weights determined on number average ($\overline{Mn}$) in the range of 1,500 to 2,100.

As can be seen from Table 7, all of the presensitized printing plates prepared using the compounds of the present invention had small change in the gray scale step number corresponding to the cleared area; that is, they had excellent development latitude.

EXAMPLE 8

Presensitized printing plates (A)-13 and (E) were prepared in the same manner as in Example 1 except that the photosensitive solution (A)-13 prepared in Example 3 and the following photosensitive solution (E) respectively were used.

| Photosensitive Solution (E): | |
|---|---|
| Silyl Ether Compound (1) Illustrated Below | 0.40 g |
| Polyethylene Glycol #300 (produced by Kanto Chemical Co., Ltd.; mean polymerization degree: 6.8) | 0.20 g |
| Cresol-Formaldehyde Novolak Resin | 1.1 g |
| 2-(p-Methoxyphenyl)-4,6-trichloromethyl-s-triazine | 0.05 g |
| Oil Blue #603 (produced by Orient Chemical Industries., Ltd.) | 0.01 g |
| Ethylene Dichloride | 10 g |
| Methyl Cellosolve | 10 g |

Silyl Ether Compound (1)

-continued

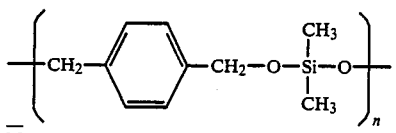

$\overline{Mn} = 1,820$

The dry coverage of this solution was 1.5 g/m².

An exposure time at which the area corresponding to the fifth step of the gray scale having a density difference of 0.15 became completely clear was determined according to the method described in Example 3 on the presensitized printing plates (A)-13, (E), and (B)-3 prepared in Example 3. Further, a difference in step number of the gray scale having a density difference of 0.15 at which the corresponding area became completely clear between 60 seconds' development and 3 minutes' development was determined according to the method described in Example 7 on the above-described presensitized plates. The results obtained as shown in Table 8.

TABLE 8

| Presensitized Printing Plate | Compound Used | Exposure Time for Clearing Fifth Step Area (sec) | Difference in Step Number of Gray Scale between Areas Cleared by 3 Minutes' and 60 Seconds' Development (step) |
|---|---|---|---|
| (A)-13 | Compound (III-15) | 15 | 1.0 |
| (E) | Comparison | 33 | 2.0 |
| (B)-3 | Comparison | 55 | 2.0 |

The compound (III-15) of the present invention set forth in Table 8 had an x/y ratio of 50/50 (by mole), and the integer n in its structural formula was 6.8 on average. In addition, it has a number average molecular weight ($\overline{Mn}$) of 1,880.

As can be seen from Table 8, the compound of the present invention which has both a silyl ether group capable of being decomposed by an acid and a hydrophilic group in the same molecule contributed greatly to the increase in both photosensitivity and development latitude, compared with the system in which the hydrophilic compound was added singly.

While the invention has been described in detail and with reference to specific embodiments thereof, it will be apparent to one skilled in the art that various changes and modifications can be made therein without departing from the spirit and scope thereof.

What is claimed is:

1. A photosolubilizable composition containing a first compound capable of producing an acid by irradiation in admixture with a second compound having at least one silyl ether or silyl ester group capable of being decomposed by an acid, said second compound being selected from a Compound (a) and Compound (b), said first compound being present in an amount sufficient to increase the solubility in a developing solution of said second compound upon producing said acid, with the ratio of said first compound to the second compound being from 0.001/1 to 2/1, wherein said Compound (a) is a compound including at least one silyl ether group represented by formula (Ib):

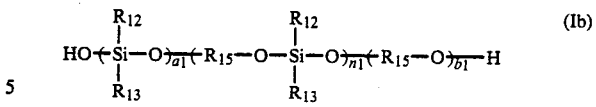

wherein $R_{12}$, $R_{13}$ and $R_{14}$ each represents a hydrogen atom, an alkyl group, an alkenyl group, an aryl group, an aralkyl group, a halogen atom, or $-OR_{16}$; $R_{15}$ represents a divalent aliphatic or aromatic hydrocarbon residue; $R_{16}$ represents an alkyl group, an aryl group, or an aralkyl group; or $R_{15}$ and $R_{16}$ may combine with each other to form a part of an aliphatic or aromatic ring; $n_1$ represents a positive integer; and $a_1$ and $b_1$ each represents 0 to 1, and said Compound (b) is a compound including at least one silyl ester group represented by formula (IIb):

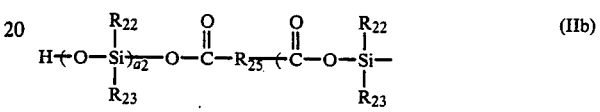

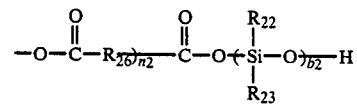

wherein $R_{22}$, $R_{23}$ and $R_{24}$ each represents a hydrogen atom, an alkyl group, an alkenyl group, an aryl group, an aralkyl group, an alkoxy group, a halogen atom, or

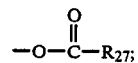

$R_{25}$ and $R_{26}$ each represents a divalent aliphatic or aromatic hydrocarbon residue; $R_{27}$ represents an alkyl group, an aryl group, or an aralkyl group; $n_2$ represents a positive integer; and $a_2$ and $b_2$ each represents 0 or 1.

2. A photosolubilizable composition as in claim 1, wherein said Compound (a) is a Compound (c) having at least one silyl ether group of said formula (Ib) and at least one hydrophilic group.

3. A photosolubilizable composition as in claim 2, wherein said at least one hydrophilic group is represented by one of the following formulae:

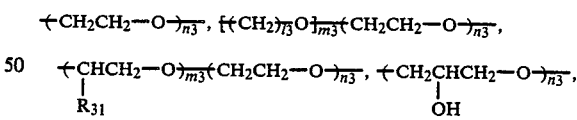

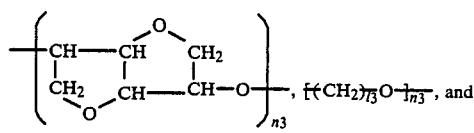

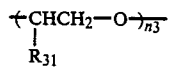

wherein $l_3$ represents an integer of 1 to 4; $m_3$ and $n_3$ each represents an integer of 0 or more; and $R_{31}$ represents an alkyl group or a phenyl group.

4. A photosolubilizable composition as in claim 3, wherein Compound (c) includes the group $+CH_2CH_2-O+_{n_3}$ as the hydrophilic group.

5. A photosolubilizable composition as in claim 1, wherein said first compound capable of producing an acid is orthoquinonediazidosulfonyl chloride, an s-triazine derivative substituted by a halomethyl group, or an oxadiazole derivative substituted by a halomethyl group.

6. A photosolubilizable composition as in claim 2, wherein said first compound capable of producing an acid is orthoquinonediazidosulfonyl chloride, an s-triazine derivative substituted by a halomethyl group, or an oxadiazole derivative substituted by a halomethyl group.

7. A photosolubilizable composition as in claim 3, wherein said first compound capable of producing an acid is orthoquinonediazidosulfonyl chloride, an s-triazine derivative substituted by a halomethyl group, or an oxadiazole derivative substituted by a halomethyl group.

8. A photosolubilizable composition as in claim 4, wherein said first compound capable of producing an acid is orthoquinonediazidosulfonyl chloride, an s-triazine derivative substituted by a halomethyl group, or an oxadiazole derivative substituted by a halomethyl group.

9. A photosolubilizable composition as in claim 1, wherein the ratio of the first compound to the second compound is from 0.02/1 to 0.8/1.

10. A photosolubilizable composition as in claim 2, wherein the ratio of the first compound to the second compound is from 0.02/1 to 0.8/1.

11. A photosolubilizable composition as in claim 5, wherein the ratio of the first compound to the second compound is from 0.02/1 to 0.8/1.

12. A photosolubilizable composition as in claim 6, wherein the ratio of the first compound to the second compound is from 0.02/1 to 0.8/1.

13. A photosolubilizable composition as in claim 1, wherein said second compound is a compound I including at least one silyl ether group represented by formula (I)-6:

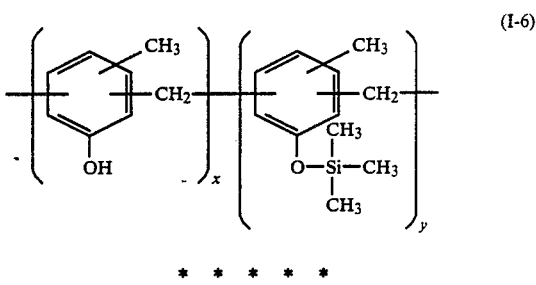

* * * * *